United States Patent
Pham et al.

(10) Patent No.: US 7,102,910 B2
(45) Date of Patent: Sep. 5, 2006

(54) PROGRAMMABLE NON-VOLATILE SEMICONDUCTOR MEMORY DEVICE

(75) Inventors: Chau Bang Pham, Eindhoven (NL); Andre Guillaume Joseph Slenter, Eindhoven (NL); Geert Gustaaf Calaerts, Eindhoven (NL); Michael Colin Hemings, Eindhoven (NL); Duy Nguyen, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/536,914

(22) PCT Filed: Oct. 31, 2003

(86) PCT No.: PCT/IB03/04939

§ 371 (c)(1),
(2), (4) Date: May 31, 2005

(87) PCT Pub. No.: WO2004/051668

PCT Pub. Date: Jun. 17, 2004

(65) Prior Publication Data

US 2006/0083040 A1    Apr. 20, 2006

(30) Foreign Application Priority Data

Dec. 5, 2002   (EP)   .................... 02080119

(51) Int. Cl.
*G11C 11/00* (2006.01)
(52) U.S. Cl. .................. 365/148; 365/100; 365/225.7; 365/185.21
(58) Field of Classification Search ................ 365/148, 365/100, 225.7, 185.21
See application file for complete search history.

(56) References Cited

U.S. PATENT DOCUMENTS 6,859,382 B1 *   2/2005   Rinerson et al. ............ 365/148

FOREIGN PATENT DOCUMENTS

| WO | WO 2002/43152 | 11/2001 |
| WO | WO 2002/052647 | 12/2001 |

* cited by examiner

*Primary Examiner*—Huan Hoang

(57) ABSTRACT

The present invention relates to a programmable non-volatile semiconductor memory device comprising a matrix of rows and columns of memory cells (1). To reduce the required memory area a 3T memory cell is proposed comprising a bridge of two bridge transistors (MN0, MN1), preferably NMOS transistors, a read transistor, preferably an PMOS transistor, and a silicided polysilicium fuse resistor (R). The read transistors enable the use of a single sense line (SL) for all memory cells (1) of the same row or column in the matrix thus enabling the use of a common sense amplifier for sensing memory cells (1).

6 Claims, 9 Drawing Sheets

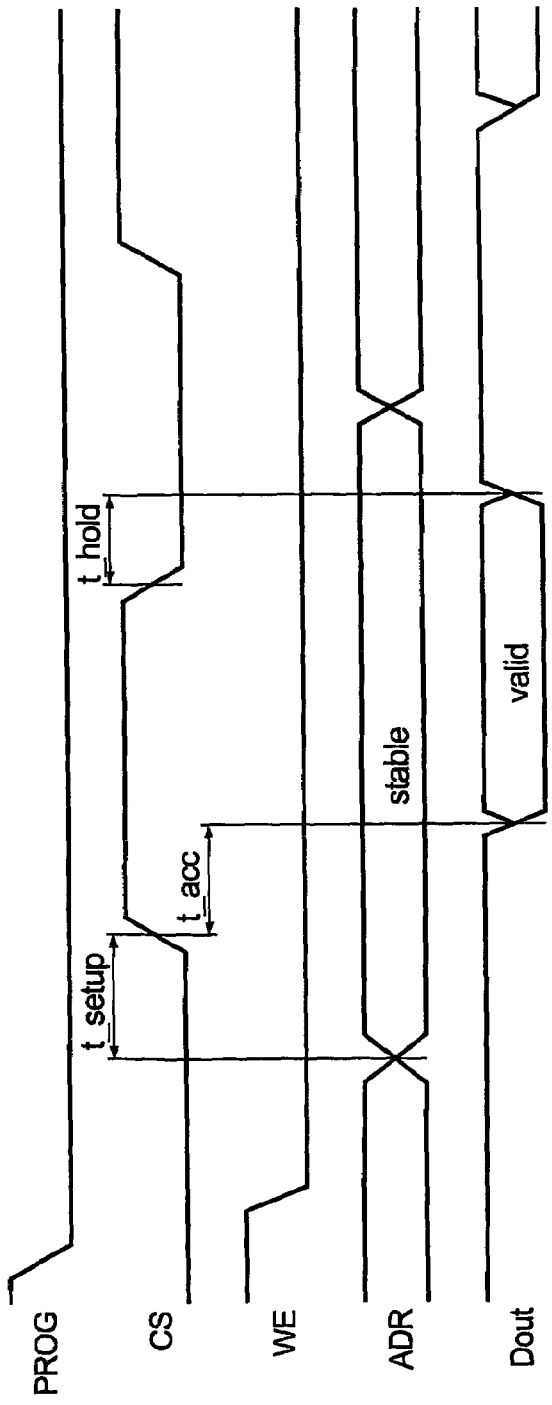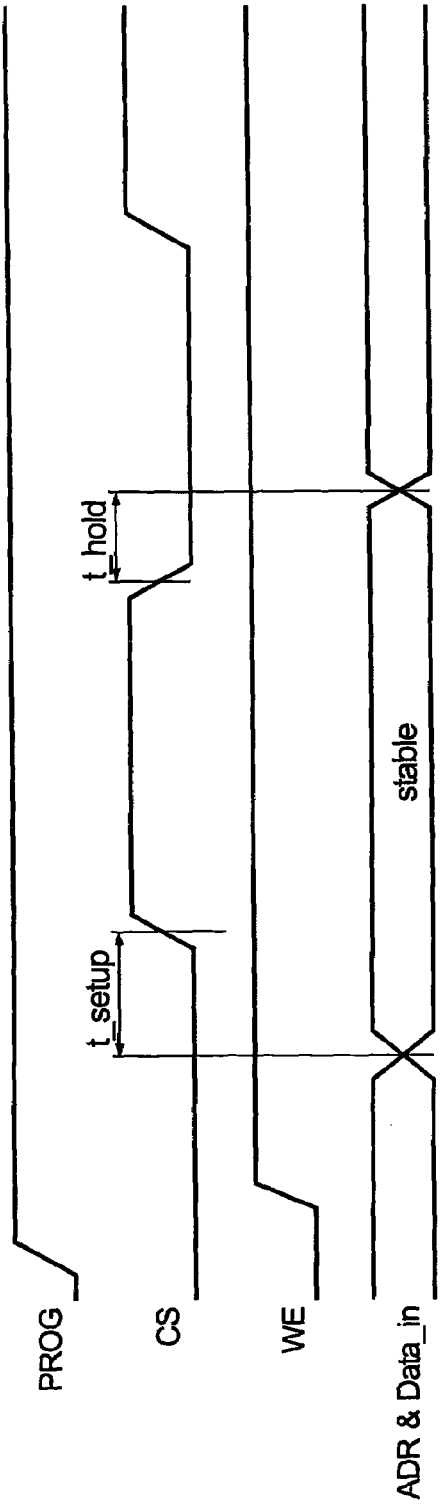

PROGRAMMABLE NON-VOLATILE SEMICONDUCTOR MEMORY DEVICE

Figure 1:
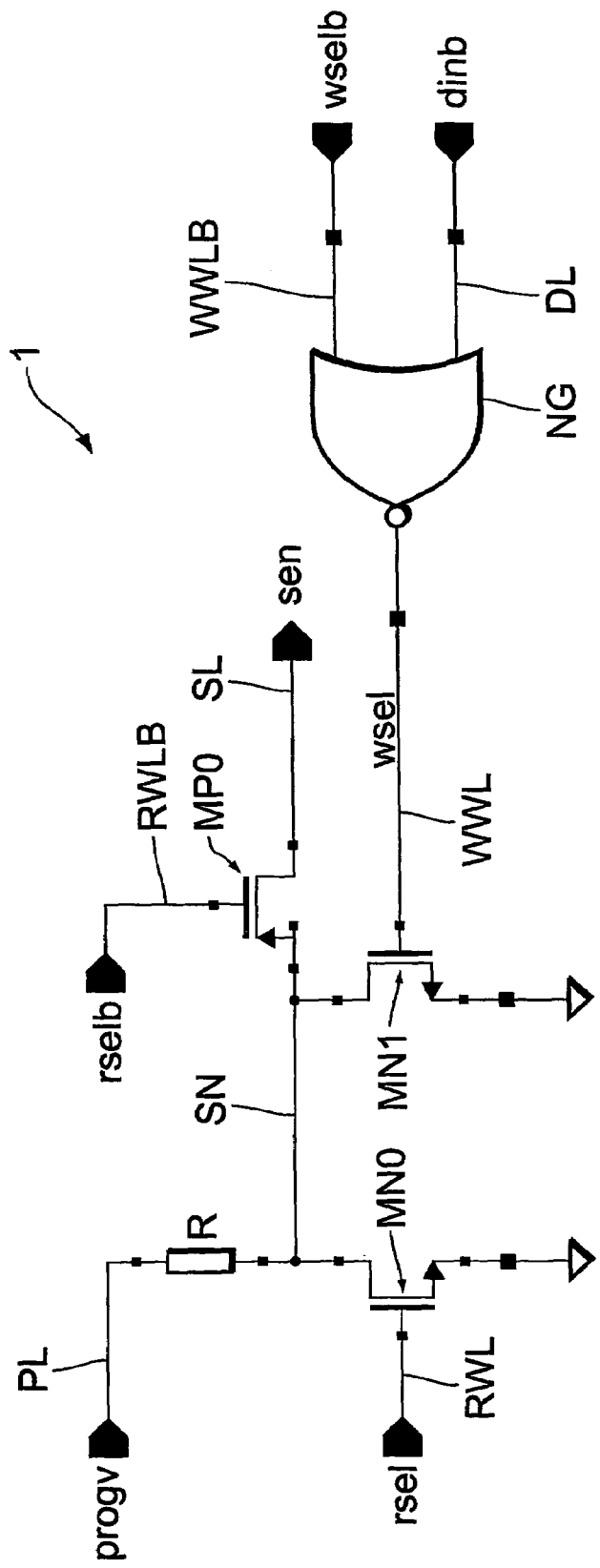

The present invention relates to a programmable non-volatile semiconductor memory device comprising a matrix of rows and columns of memory cells.

Such a semiconductor memory device having a one-time programmable (OTP) structure implemented using a self-aligned silicided (SALICIDE) poly-silicon fuse is known from WO 02/43152. In an example embodiment, the OTP structure is laid out as a fuse element surrounded by a switching transistor. To build a transistor with sufficient drive capability for programming the fuse element, the geometry of the gate of the transistor is laid out in a serpentine or an equivalent pattern. The disclosed arrangement enables the placing of read and write circuits at opposite sides of the array. All of the gates in a column may be read simultaneously while providing write current to program one fuse at a time.

The OTP ROM is an array of memory cells having fuse links. Fuse links are opened by the application of a programming current, i.e. by "blowing" which opens a fuse. The opened fuse link has an impedance much greater than that of one not programmed. Consequently, in either fuse link type, programmed cells are in a logic state opposite that of non-programmed cells.

Another semiconductor device comprising an arrangement of an electrically programmable non-volatile memory element is known from WO 02/052647. The non-volatile memory element proposed therein comprises a fuse wire and a heating wire for generating additional heat by current flow-induced joule heating which is provided with a fuse via during programming of the fuse wire by blowing it through joule heating. The heating wire is arranged as a heater spatially surrounding the fuse wire.

A programmable non-volatile semiconductor memory device where each memory cell comprises a switching transistor and a silicided poly-silicon resistor is known from WO 02/43152. However, for sensing a memory cell, i.e. for detecting if the memory cell is programmed or not, a single sense element is required for each memory cell resulting in a large memory area for the whole semiconductor memory device.

It is therefore an object of the present invention to provide a programmable non-volatile semiconductor memory device comprising a matrix of rows and columns of memory cells which require a reduced memory area.

This object is achieved according to the present invention by a programmable non-volatile semiconductor memory device as claimed in claim 1 where each memory cell comprises:

a bridge of two bridge transistors coupled in parallel, said bridge transistors being controllable by a first and second select signal via a first and second select line, a silicided polysilicium fuse resistor connected with its one end to said bridge and with its other end to a program line for programming the memory cell, and a read transistor being controllable by a third select signal via a third select line and being connected with one end to said bridge and said one end of said fuse resistor and with its other end to a sense line for sensing the memory cell.

The invention is based on the idea to insert a third read transistor into the known 2T memory cell and to connect that read transistor to a sense line for sensing the memory cell. This enables the use of a common sense element, e.g. a common sense amplifier, for all memory cells of the same row or column in the matrix of memory cells since the read transistor disconnects all not-selected cells from the common sense line. Thus the required area for the programmable memory device can be reduced.

Preferred embodiments of the invention are defined in the dependent claims. The transistors of the memory cells can be selected to be either NMOS, PMOS or CMOS transistors. Preferred is the implementation where the two bridge transistors are NMOS transistors and where the read transistor is a PMOS transistor.

According to another preferred embodiment the sources of the bridge transistors are connected to a ground voltage and the drains of the bridge transistors are connected together, to the one end of the fuse resistor and to the source of the read transistor. This implementation is preferably used when the two bridge transistors are NMOS transistors and the read transistor is a PMOS transistor.

As defined in claim 5 and as mentioned above all memory cells of the same row or column can be connected to the same sense line to which only one common sense amplifier is connected for sensing all the memory cells of the same row or column, respectively. Depending on the value of the fuse resistor it can be sensed by the sense amplifier if the memory cell is programmed or not. A selection of the memory cell to be sensed can be made by the third select signal controlling the read transistor of the particular memory cell.

In a further embodiment means for generating the select signals are provided for control of the transistors of the memory cells. For reading a memory cell the first select signal is set to be active high while for writing to a memory cell the second select signal is set to be active high. In the matrix configuration the first select signal can be considered to be a read-wordline signal and the second select signal can be considered to be a write-wordline signal. In such an embodiment the sense signal sensed on the select line can be considered to be a bitline signal.

Figure 2:
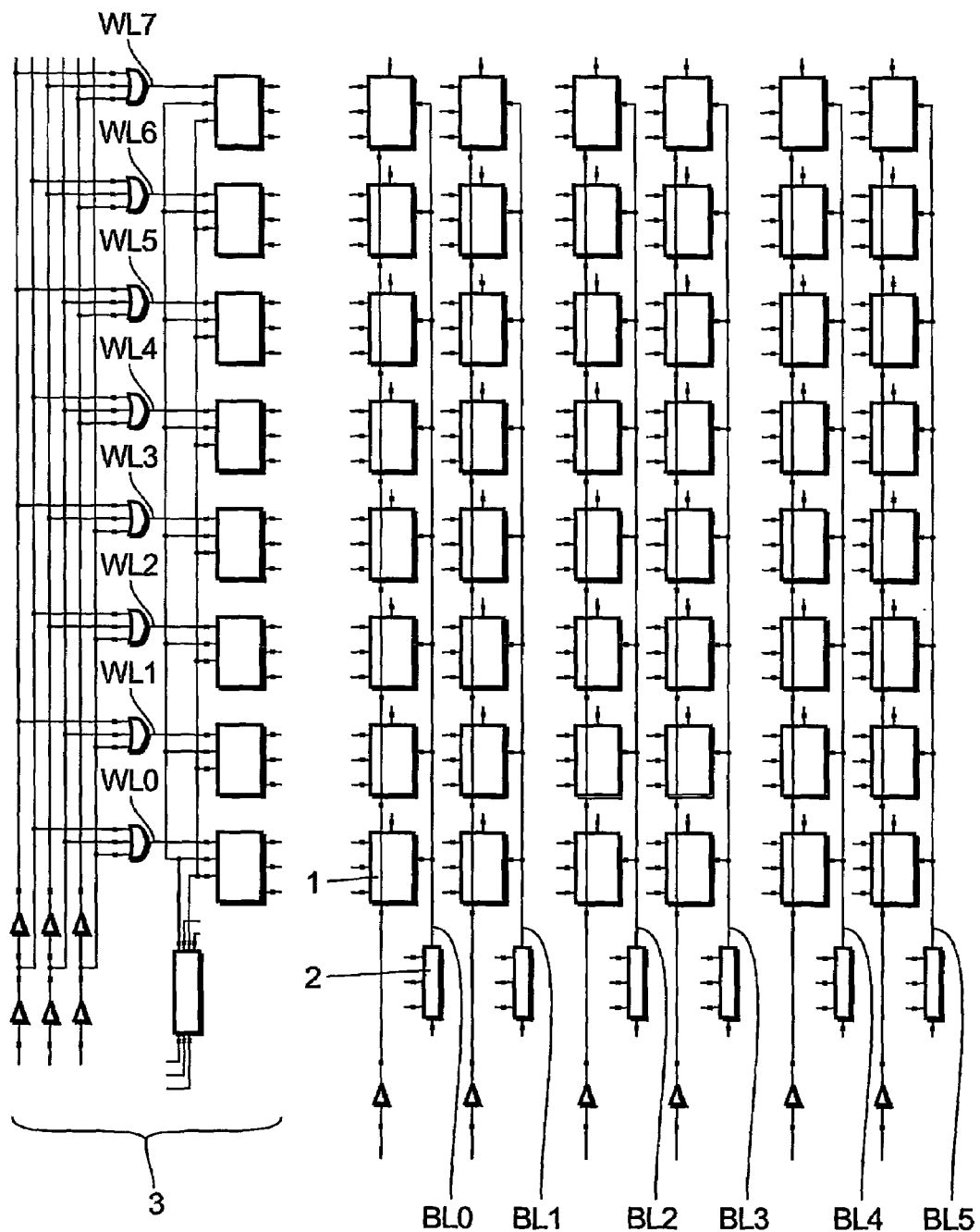
Figure 3:
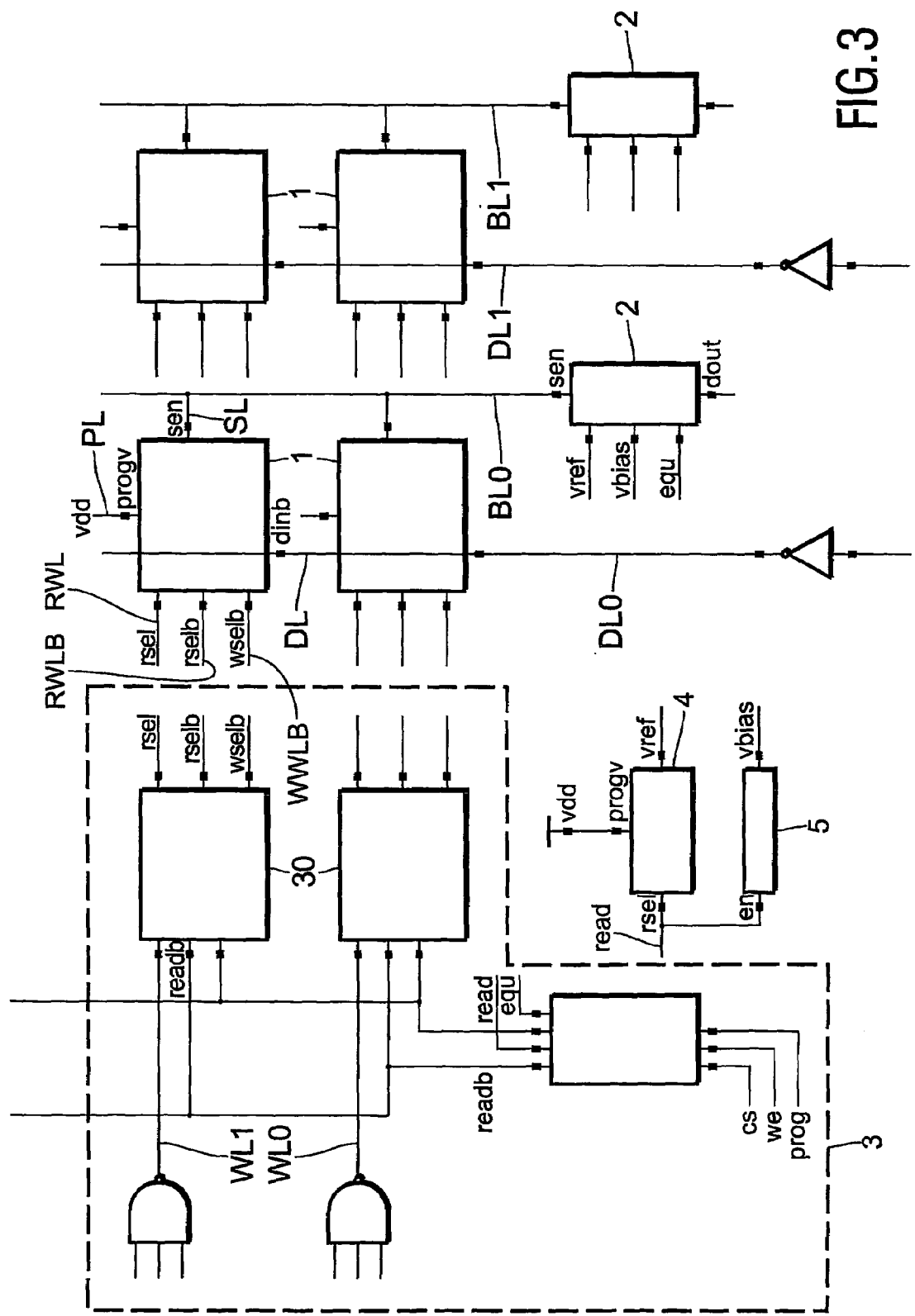
Figure 4:
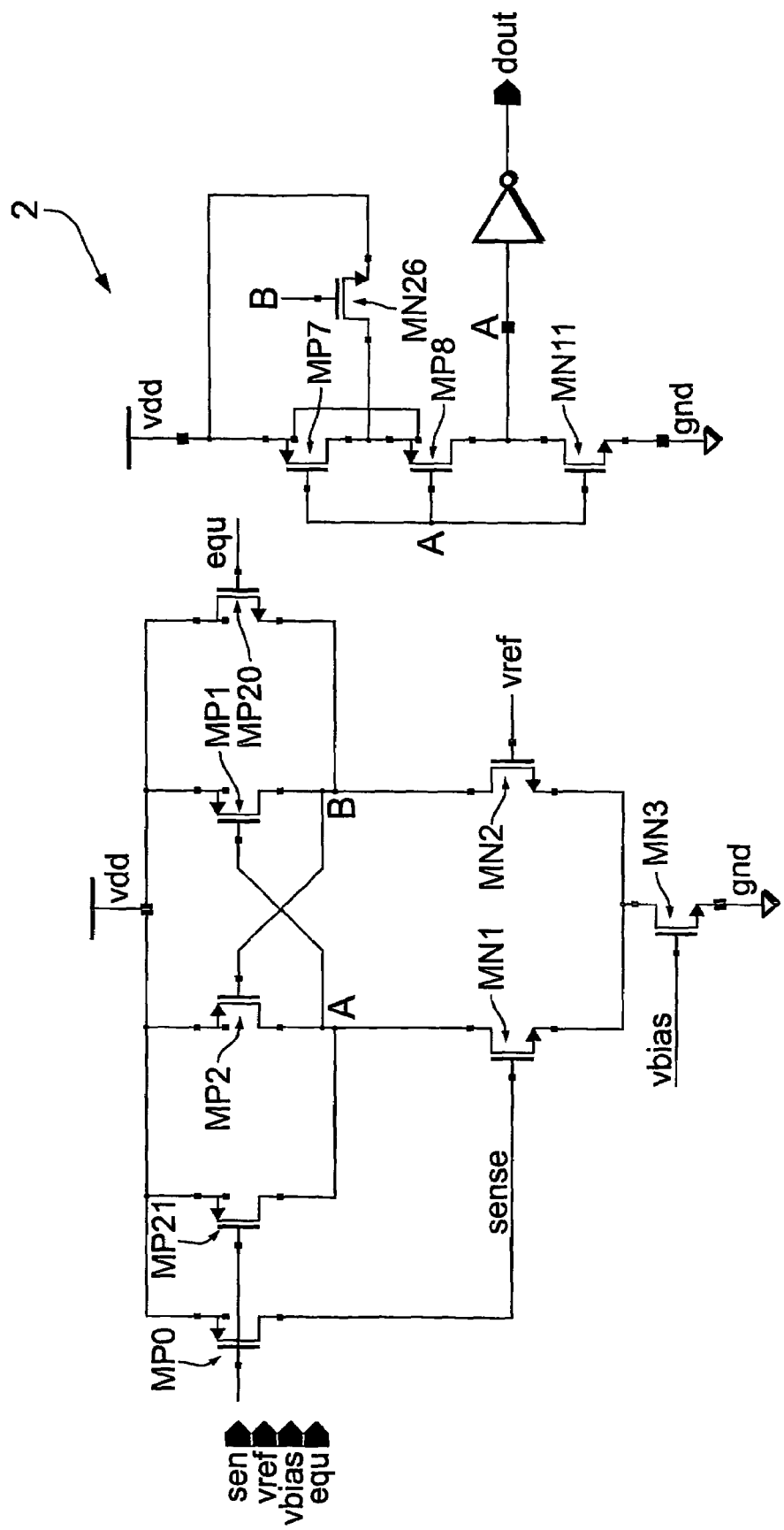
Figure 5A:
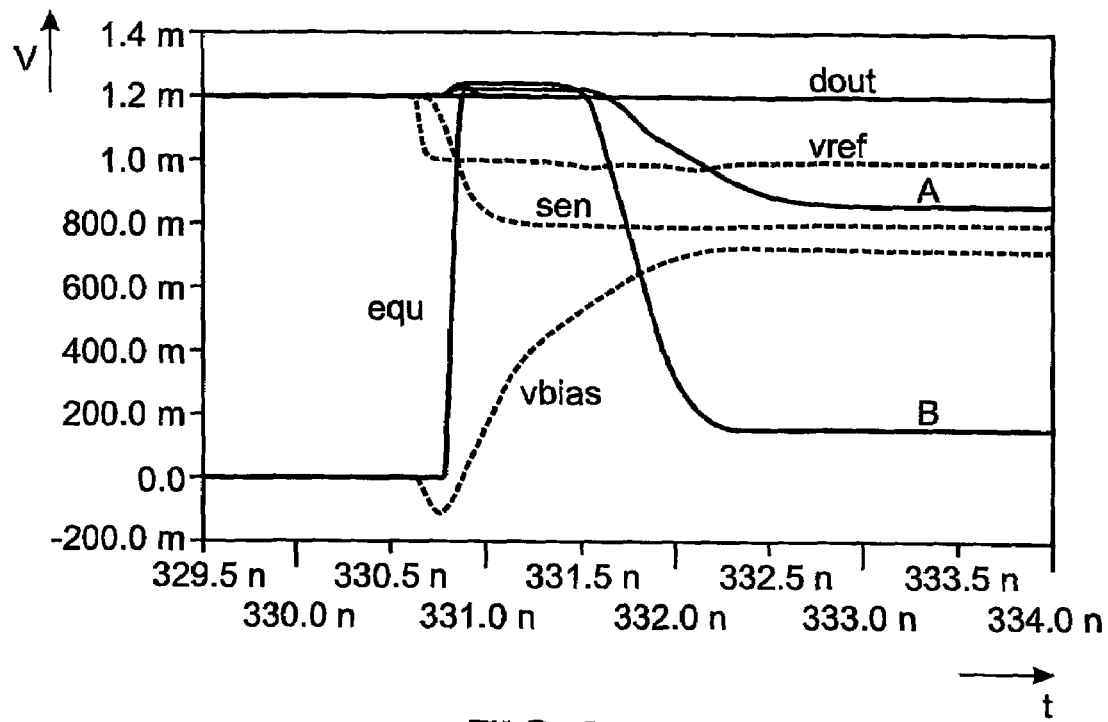
Figure 5B:
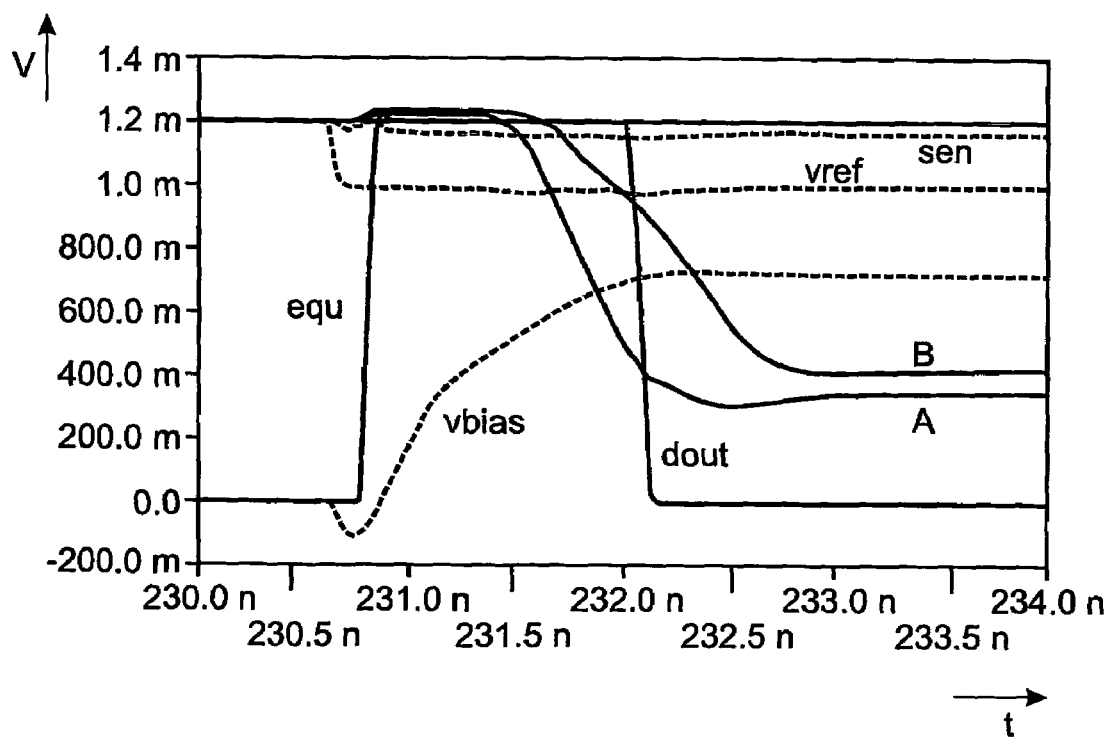
Figure 6:
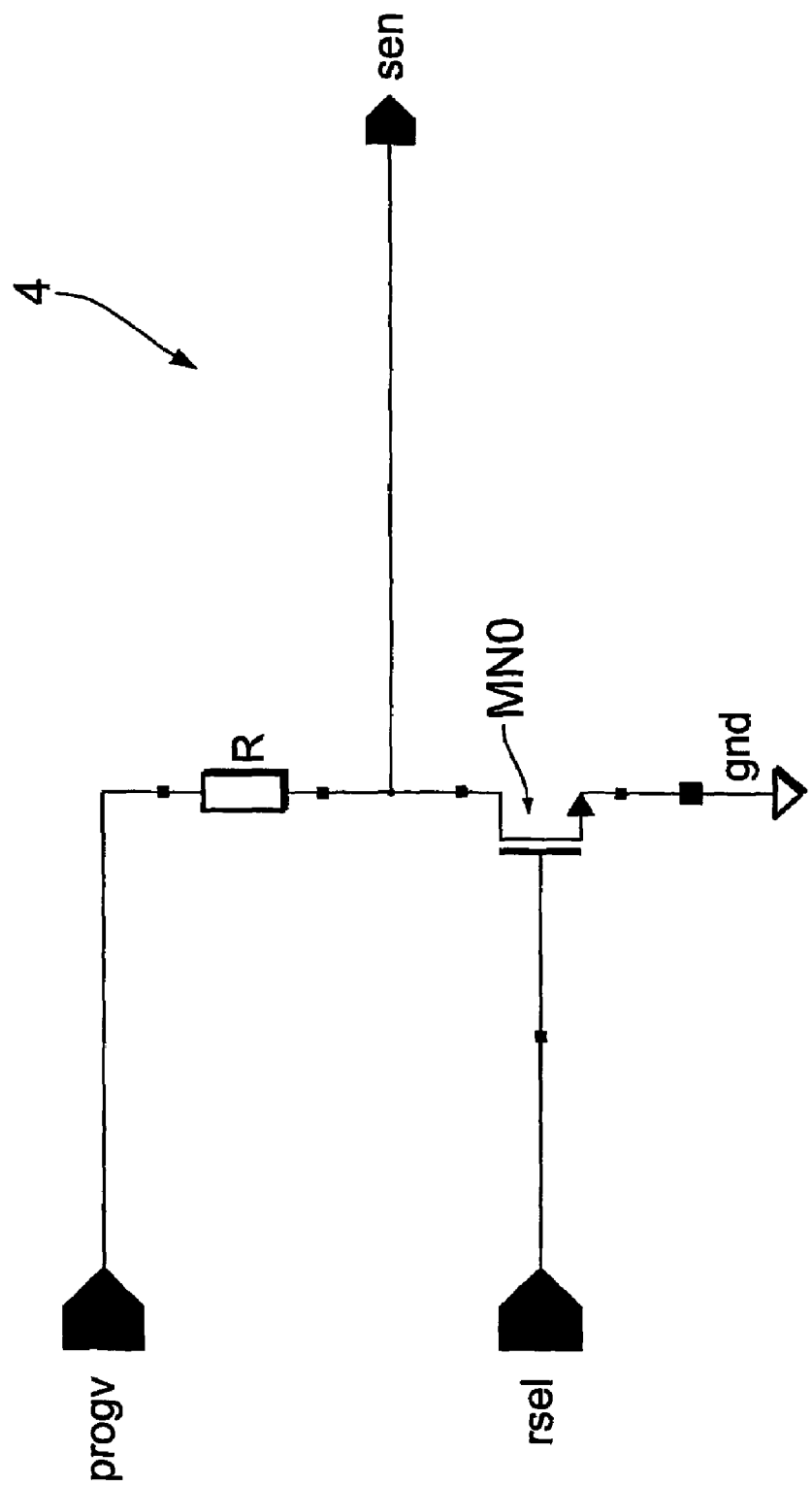
Figure 7:
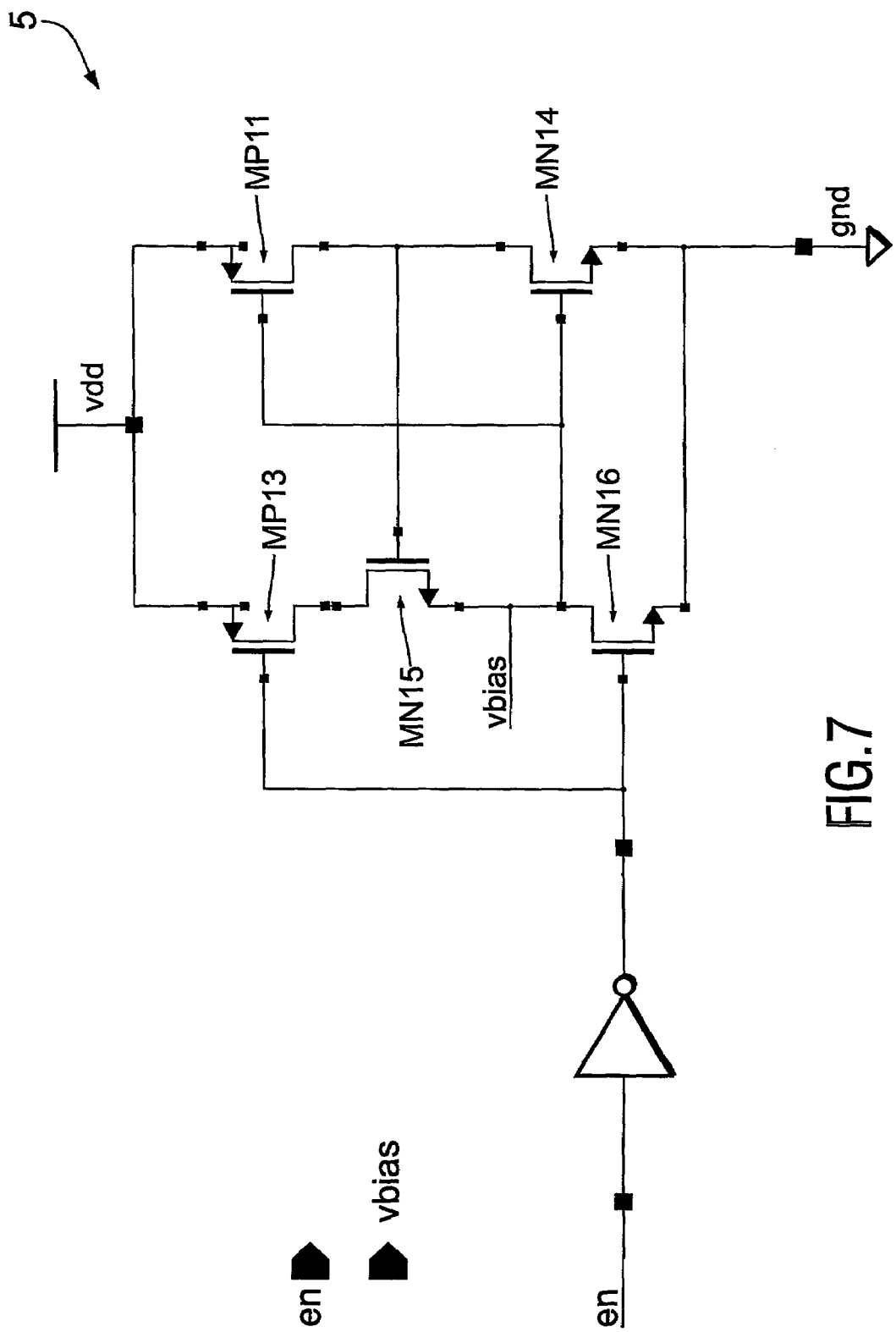
Figure 8:
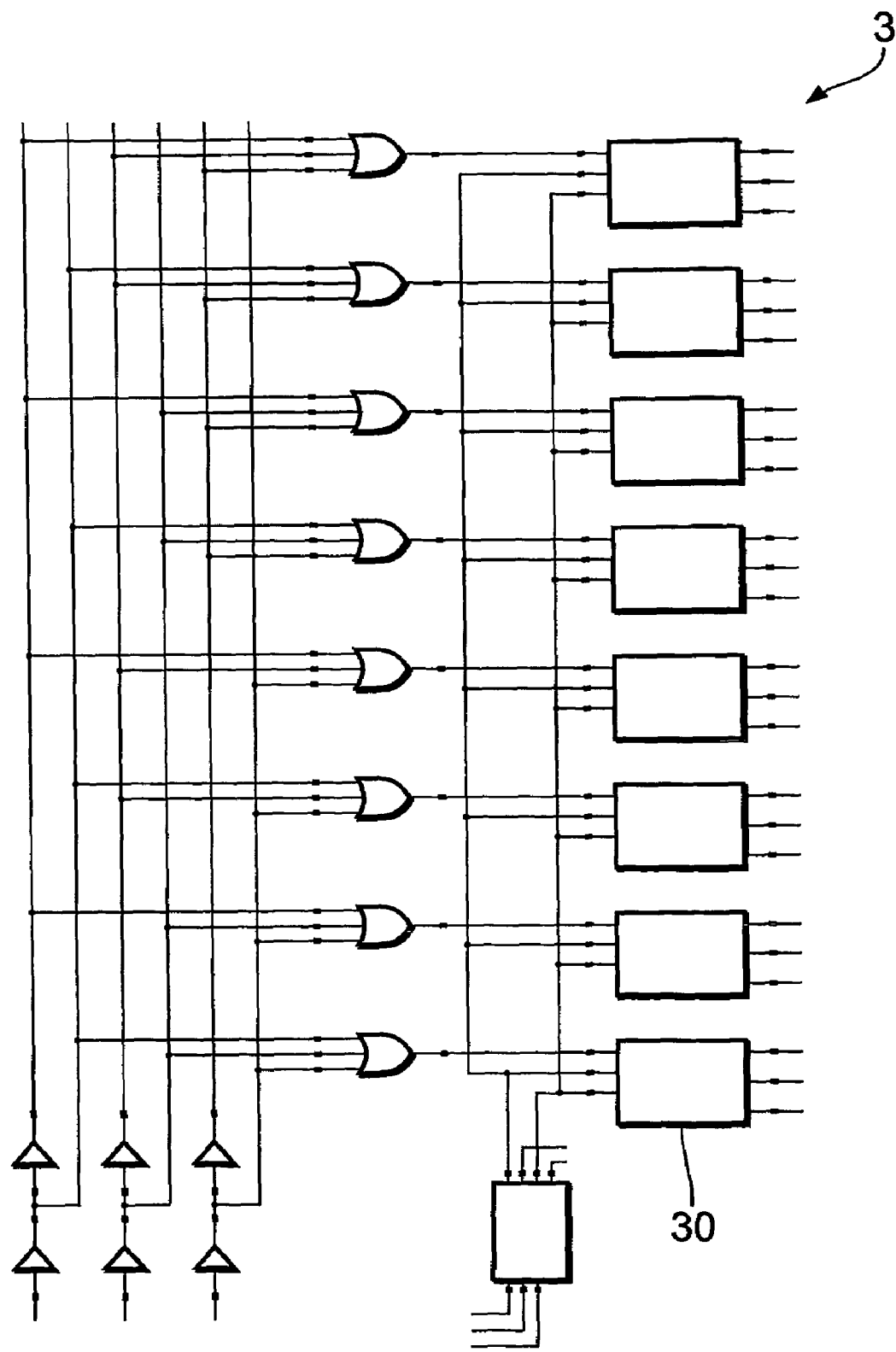

The present invention will now be explained with reference to the drawings in which FIG. 1 shows an embodiment of a memory cell according to the invention, FIG. 2 shows the general layout of a memory device according to the invention, FIG. 3 shows a part of the matrix layout shown in FIG. 2, FIG. 4 shows the layout of a sense amplifier according to the invention, FIG. 5 including FIGS. 5a and 5b shows signal diagrams of the signals in the memory device according to the invention, FIG. 6 shows the circuitry of a unit for generating a reference voltage, FIG. 7 shows the circuitry of a unit for generating a bias voltage, FIG. 8 shows the circuitry of an address decoder used in the memory device according to the invention and FIG. 9 including FIGS. 9a and 9b shows signal diagrams for reading and writing a memory cell according to the invention.

FIG. 1 shows a preferred embodiment of the circuitry of a memory cell 1 according to the present invention. It comprises two bridge transistors MN0, MN1 whose drains are connected together and whose sources are both connected to a ground voltage level. The first bridge transistor MN0 is controllable by a first select signal, in particular a read-select signal rsel provided on a read wordline RWL. The second bridge transistor MN1 is controllable by a second select signal, in particular a write-select signal wsel provided on a write-wordline WWL. The common drain connection of said transistors MN0, MN1, called sense node SN in the following, is connected to a first end of a silicided polysilicium fuse resistor R which is connected to a program line PL with its other end for providing a program signal progv for programming the memory cell 1.

The memory cell 1 further comprises a read transistor MP0 which is connected with its source to the sense node SN and with its drain to a sense line SL on which the current state of the memory cell 1 can be sensed via a sense signal sen. The read transistor MP0 is controllable by a third select signal, in particular a read select signal bar rselb, provided on a read wordline bar RWLB. A data signal dinb is provided on a data line DL. The data signal dinb is inputted to a NOR gate NG to which a write select signal bar wselb on a write wordline bar is also inputted. The exit of the NOR gate NG is connected to the write wordline WWL.

The function of the memory cell 1 is as follows. The fuse resistor R is a silicided polysilicium resistor. As an example, the active polysilicium resistance ranges from 30 to 71 ohm. Writing to the memory cell 1 is done by setting a write select signal wsel to active high. For instance, a current flow of 10 mA is required for 100 ms. A higher polysilicium resistor R will result in a high dissipation which in turn causes the fusing of the resistor R. For this reason a strong NMOS transitor MN1 is required for programming.

In read mode the read select signal rsel is set to active high. Then, the first bridge transistor MN0, also implemented as NMOS transistor, acts as a current source of, for instance, 400 µA. Depending on the value of the fuse resistor R, voltage swing on the sense node SN will be used further for sensing via an external sense element when the read select signal bar rselb is set to active low to switch the read transistor MP0, which is implemented as PMOS transistor, in the conducting state.

In typical conditions voltage on the sense node SN is about 1.16V for an unprogrammed cell having a resistance of 80 ohm and 0.80V for a programmed cell having a resistance of 1000 ohm. Furthermore, the write select signal wsel is only active when both the write select signal bar wselb and the data signal dinb are active low.

The described embodiment shown in FIG. 1 using two NMOS transistors MN0, MN1 and one PMOS transistor MP0 is an optimised solution for low voltage CMOS, for example CMOS 12 using 1.2 volt as supply voltage. However, some or all transistors could also be changed to NMOS or PMOS technology. If the read transistor MP0 is replaced by an NMOS transistor the voltage swing on the sense node SN which is used for sensing will be decreased due to a threshold voltage. The same influence will be obtained when the bridge transistors MN0 and MN1 are changed to PMOS technology. Furthermore, PMOS technology will require more memory area than NMOS for the same transistors.

FIG. 2 shows the matrix configuration of the semiconductor memory device according to the present invention. A number of memory cells 1 are arranged along the rows and columns of an array. Shown are in this example eight rows which can be addressed by different wordlines WL0–WL7 of an address decoder 3. Further the matrix comprises six columns which can be addressed by bitlines BL0–BL5 which correspond to the sense line SL shown in FIG. 1. To each of these bitlines BL0–BL5 a common sense amplifier 2 is connected.

Part of the matrix shown in FIG. 2 is also shown in FIG. 3 on a larger scale. Shown are, besides the memory cells 1 and the sense amplifiers 2 the circuitry of the address decoder 3, a vref-generator 4 and a vbias generator 5. Further, the signals inputted to the different elements are indicated. Each bitline in the matrix represents one bit output in the vertical direction. For wordline selection a concept of 1 out 8 decoder is used. In horizontal direction for each memory cell 1 there are three wordlines, in particular a write wordline providing a write select signal bar wselb, a read wordline providing a read select signal rsel and a read wordline bar providing a read select signal bar rselb. Inverting of the read select signal rsel is centralized at wordline drivers 30 of the address decoder 3 instead of a local inversion to save memory area. Common bitlines BL (=sense lines SL) and common data lines DL for data input are used in vertical direction.

A circuitry of a sense amplifier 2 is shown in more detail in FIG. 4. It has as inputs the sense signal sen provided from the memory cell 1 to be sensed via the sense line SL, a reference voltage vref provided from the reference voltage generator 4, a bias voltage vbias provided from the bias generator 5 and an equ-signal provided from the addressed decoder 3 used to shorten both sense nodes of the sense amplifier on the same level before sensing. The sense amplifier 2 outputs a data-out signal dout.

With a margin of, for instance, almost 300 mV between a programmed and a virgin memory cell a simple voltage sensing amplifier is applied to read out the data content of the selected memory cell. Based on the concept of a single memory cell per bit, a single-ended sense amplifier as shown in FIG. 4 is used as follows: in stand-by mode the sense signal sen and the reference voltage vref are equalized and precharged at the supply voltage level vdd. In read mode the equalize transistors MP0, MP20 are switched off. If the read wordline of the selected memory cell becomes active, the voltage on the sense node of the selected memory cell is propagated to the common bitline. The reference voltage vref is set to a reference level, for instance about 0.99V. Depending on the data content of the selected memory cell, the voltage on the sense node will swing between 1.12V or 0.80V (as an example) which will force the sense amplifier 2 to get into a certain state. A half smit-trigger is used to convert the output A to CMOS level. Adjusting of the break point of the amplifier is done by a voltage level at the bias voltage vbias. In stand-by mode the bias voltage vbias is set to ground voltage to block a DC current on both sides of the amplifier.

FIG. 5a shows signal diagrams of the signals when reading a "1", i.e. from a programmed memory cell. FIG. 5b shows the signal diagrams of the signals when reading a "0", i.e. from an unprogrammed memory cell. Due to equalizing at vdd-level on the sense-input of the sense amplifier 2 the data output dout remains at vdd-level during reading a "1". The minimum value of the fuse resistor of the programmed memory cell must therefore be greater than the fuse resistor of the reference memory cell, which is, for instance, 400 ohm. In a normal condition, i.e. in the 1.2 Voltage type process, an access time of 1.3 ns is expected for reading a "0".

The layout of a reference voltage generator 4 is shown in FIG. 6. Acting as a virgin memory cell, the reference voltage generator 4 is built up from a memory cell with 5 polysilicium resistors in series. Using the same current source as the active memory, an output of vdd−(5×R)×I_read is expected. At typical condition, i.e. for an 1.2 voltage type process at 25° C. a reference voltage vref of approximately 0.99V is outputted. Controlled by the chip select signal cs, the read select signal resl will be switched off, so that there is no power consumption in the reference voltage generator in stand-by mode. Depending on the resistance value of the programmed fuse resistor a shorted circuit over the fuse resistors could be made to adjust an optical margin for sensing.

An embodiment of the layout of the bias voltage generator 5 is shown in FIG. 7. Therein a Miller convert is used for creating a bias voltage level for all sense amplifiers. An enable signal en is set to active high in read mode. The voltage on the node vbias is charged by transistor MN15 to the threshold level of the transistor MN14. The transistor M14 begins to conduct in sub-threshold area to discharge voltage on the gate of the transistor MN15. As a consequence of this feedback voltage level on the vbias node is limited at the Vtn-level, i.e. the threshold voltage of NMOS. In stand-by mode the bias voltage vbias is discharged via the transistor MN16 to ground level gnd; no DC-currents are flowing in both branches when the transistors MP13 and M14 are switched off.

An embodiment of the general layout of the address decoder 3 is shown in FIG. 8. Based on the requirement of Veliqua12, decoding of 1-out-8 is applied for decoding of 8 wordlines in total, as shown in FIG. 8. I.e. only one wordline is active from 8, coded by address A0, A1 and A2. Depending on the required memory size, a pre-decoder or post-decoder could be used. A 3-input OR is used instead of a 3-input NAND as specified in the configuration to reduce the required chip area A bfx4 and ivx4 wordline driver is used as wordline drivers 30 which allow for memory extension to 64-bits wide.

The operation modes of a semiconductor memory device according to the present invention are shown in FIGS. 9*a*, for a read cycle, and 9*b*, for a write cycle. The memory device is activated by setting the chip select signal cs into active state. The read mode is selected by setting the program signal PROG and the write enable signal WE into low state as shown in FIG. 9*a*. In the write mode, both the program signal PROG and the write enable signal WE are put in high state as shown in FIG. 9*b*.

The invention claimed is:

1. A programmable non-volatile semiconductor memory device comprising a matrix of rows and columns of memory cells each comprising a bridge of two bridge transistors coupled in parallel, said bridge transistors being controllable by a first and second select signal via a first and second select line, a silicided polysilicium fuse resistor connected with its one end to said bridge and with its other end to a program line for programming the memory cell, and a read transistor being controllable by a third select signal via a third select line and being connected with one end to said bridge and said one end of said fuse resistor and with its other end to a sense line for sensing the memory cell.

2. A semiconductor memory device as claimed in claim 1, wherein said bridge transistors and said read transistor are NMOS, PMOS or CMOS transistors.

3. A semiconductor memory device as claimed in claim 1, said bridge comprises two NMOS transistors and wherein said read transistor is a PMOS transistor.

4. A semiconductor memory device as claimed in claim 1, wherein the sources of said bridge transistors are connected to a ground voltage and wherein the drains of said bridge transistors are connected together, to the one end of said fuse resistor and to the source of said read transistor.

5. A semiconductor memory device as claimed in claim 1, further comprising a number of sense amplifiers connected to different sense lines, wherein all read transistors of all memory cells of the same row or column are connected to the same sense line to which a common sense amplifier is connected.

6. A semiconductor memory device as claimed in claim 1, further comprising means for generating said select signals for control of said transistors which are adapted for setting said first select signal active high in for reading a memory cell and for setting said second select signal active high for writing to a memory cell.

* * * * *